United States Patent [19]

Yamada et al.

[11] Patent Number: 4,564,917
[45] Date of Patent: Jan. 14, 1986

[54] SPEED DISPLAY DEVICE FOR AUTOMOTIVE VEHICLE

[75] Inventors: Motokazu Yamada, Nagoya; Hideyuki Hayakawa, Nishio; Tomonori Fukui, Kariya; Hajime Matsuhashi, Kariya; Yasuhiro Kaneko, Kariya; Motozo Ikeda, Kariya; Tomihiko Nagata, Oobu, all of Japan

[73] Assignee: Nippondenso Co., Ltd., Kariya, Japan

[21] Appl. No.: 515,874

[22] Filed: Jul. 21, 1983

[30] Foreign Application Priority Data

Jul. 29, 1982 [JP] Japan .................................. 57-132821

[51] Int. Cl.$^4$ ................................................ G06F 3/14
[52] U.S. Cl. ...................................... 364/565; 364/424; 340/735; 340/756; 324/160
[58] Field of Search .................. 364/424, 565; 340/62, 340/715, 735, 753, 754, 790; 73/488; 324/160, 161, 163, 166; 377/19, 20, 24

[56] References Cited

U.S. PATENT DOCUMENTS

| | | | |
|---|---|---|---|
| 3,202,980 | 1/1963 | Stone et al. | 340/756 X |
| 3,958,232 | 5/1976 | Hobrough et al. | 340/735 X |
| 4,270,196 | 5/1981 | Terzian | 340/756 X |
| 4,463,355 | 7/1984 | Schultz et al. | 364/565 X |

Primary Examiner—Gary Chin
Attorney, Agent, or Firm—Cushman, Darby & Cushman

[57] ABSTRACT

In a speed display device of the numerical display type which comprises a speed sensor for producing an electric speed signal indicative of a travel speed of the vehicle, and an electric display responsive to the speed signal for providing a numerical display indicative of the travel speed of the vehicle, the improvement comprises an electric control device responsive to the speed signal for successively enlarging the size of the numerical display in accordance with rise of the speed level. Alternatively, the electric control device may be arranged to be responsive to the speed signal for successively inclining the shape of the numerical display in accordance with rise of the speed level.

2 Claims, 5 Drawing Figures

SPEED DISPLAY DEVICE FOR AUTOMOTIVE VEHICLE

BACKGROUND OF THE INVENTION

The present invention relates to a vehicle speed display device of the numerical display type to provide a numerical display indicative of an instant travel speed of the vehicle, and more particularly to an improvement of the numerical display on the speed display device.

In a conventional speed display device of the numerical display type, the numeral indicative of an instant travel speed of the vehicle is displayed always in the same size. In such numerical display, it is enable to recognize the instant travel speed at a glance of the displayed numeral, but unable to clearly read the displayed numeral when the driver's attention is drawn to the forward road during travel of the vehicle at a high speed. Meanwhile, a conventional analogue speed display device of the needle indication type is suitable to intuitively read an instant travel speed of the vehicle, but unsuitable to accurately read the instant travel speed.

SUMMARY OF THE INVENTION

It is, therefore, a primary object of the present invention to provide an improved vehicle speed display device of the numerical display type in which the numeral indicative of an instant travel speed of the vehicle is adjusted to vary in its size and/or shape in accordance with change of the vehicle travel speed to ensure accurate and intuitive recognition of the travel speed.

According to the present invention from an aspect there is provided a speed display device of the numerical display type for automotive vehicles, which comprises speed detecting means for producing an electric speed signal indicative of a travel speed of the vehicle, and numerical display means responsive to the speed signal for providing a numerical display indicative of the travel speed of the vehicle, and wherein the improvement comprises control means responsive to the speed signal for successively enlarging the size of the numerical display in accordance with rise of the speed level.

According to the present invention from another aspect there is provided a speed display device of the numerical display type for automotive vehicles, which comprises speed detecting means for producing an electric speed signal indicative of a travel speed of the vehicle, and numerical display means responsive to the speed signal for providing a numerical display indicative of the travel speed of the vehicle, and wherein the improvement comprises control means responsive to the speed signal for successively inclining the shape of the numerical display in accordance with rise of the speed level.

In the actual practices of the present invention, it is preferable that the control means comprises memory means arranged to memorize a plurality of numerical display patterns for enlarging the size of the numerical display in accordance with rise of the speed level, computer means responsive to the speed signal to select one of the memorized display patterns in accordance with the level of the speed signal and to produce an output signal indicative of a display data under the selected display pattern, and adjusting means responsive to the output signal from the computer means for adjusting the size of the numerical display in dependence upon the value of the display data.

Alternatively, the control means may comprise memory means arranged to memorize a plurality of numerical display patterns for successively inclining the shape of the numerical display in accordance with rise of the speed level, computer means responsive to the speed signal to select one of the memorized display patterns in accordance with the level of the speed signal and to produce an output signal indicative of a display data under the selected display pattern, and adjusting means responsive to the output signal from the computer means for adjusting the inclination of the numerical display in dependence upon the value of the display data.

BRIEF DESCRIPTION OF THE DRAWINGS

Additional objects, advantages and features of the present invention will become readily apparent from the following detailed description of preferred embodiments thereof taken in conjunction with the accompanying drawings, in which.

DETAILED DESCRIPTION OF THE PREFERRED EMBODIMENTS

Figure 1:
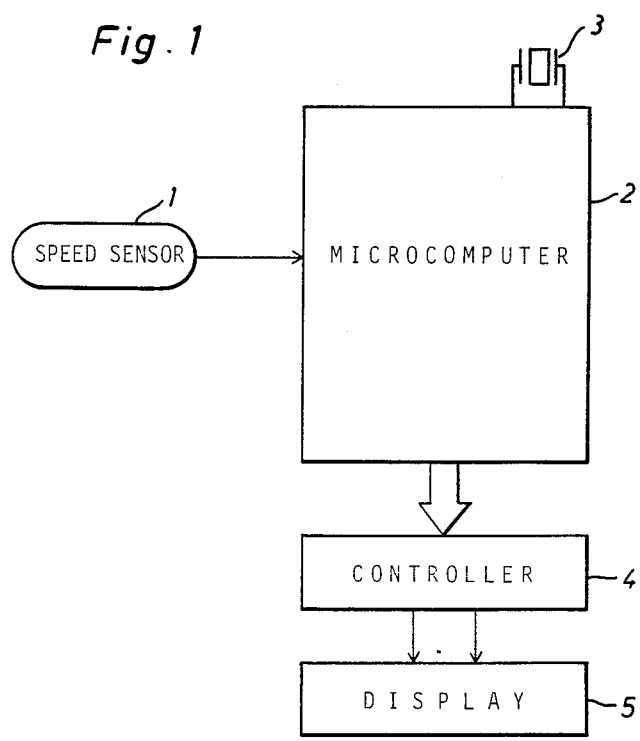
FIG. 1 is a block diagram of a vehicle speed display device in accordance with the present invention.

As is illustrated in FIG. 1 of the accompanying drawings, a vehicle speed display device according to the present invention comprises a vehicle speed sensor 1, a microcomputer 2, a cathode-ray tube or CRT controller 4, and a cathode-ray tube or CRT display means 5. The vehicle speed sensor 1 is arranged in a usual manner to produce four pulses per one rotation of a speedometer cable (not shown) thereby to measure an instant travel speed of the vehicle. The computer 2 includes a central processing unit or CPU, a read only memory or ROM, a random access memory or RAM, an input-output device or I/O, a clock circuit, and a counter for calculation of the speed pulses applied from sensor 1. The clock circuit in computer 2 is cooperable with a crystal oscillator 3 to produce clock signals at a predetermined frequency. CPU in computer 2 is connected through a bus line to the clock circuit to execute a predetermined calculation program in response to the clock signals from the clock circuit.

Figure 2:
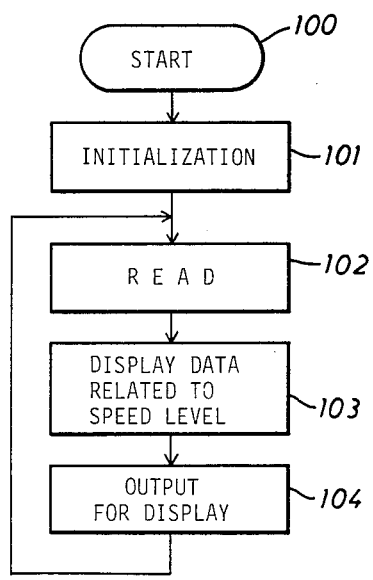
FIG. 2 is a flow chart for a main calculation routine to be executed by a microcomputer of FIG. 1.
Figure 3:
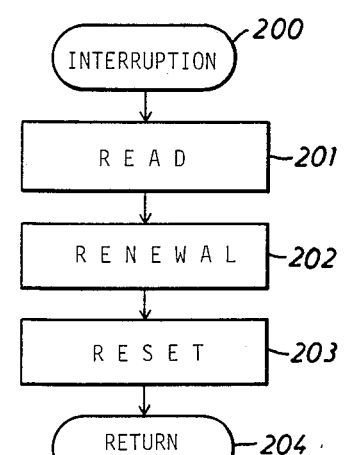
FIG. 3 is a flow chart for an interruption routine to be executed by the computer.

In such arrangement as described above, the vehicle speed display device is conditioned in its operation such that the computer 2 is supplied in a usual manner with a constant voltage from a voltage stabilizer to initiate execution of the predetermined calculation program according to flow charts of FIGS. 2 and 3. During such execution of the calculation program, the counter in computer 2 counts the number of speed pulses from sensor 1 to obtain a data indicative of an instant travel speed of the vehicle, and CPU produces an output signal indicative of the data for numerical display. The CRT controller 4 is used to receive and memorize the output signal indicative of the data from CPU and to produce a display signal indicative of the memorized speed data and a synchronous signal therewith. The CRT display means 5 is responsive to the display and synchronous signals from CRT controller 4 to provide a numerical display indicative of the vehicle travel speed in such a selected size as described later.

Figure 4:
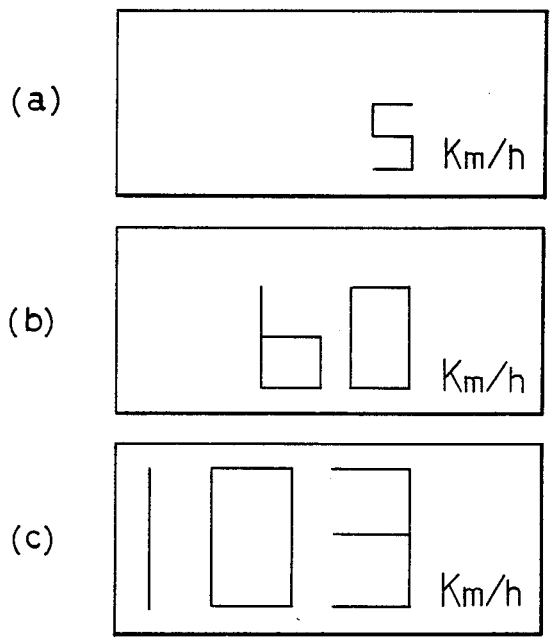
FIG. 4 illustrates numerical display patterns in an embodiment of the present invention.

In this embodiment, the vehicle speed display device is characterized in that ROM in computer 2 is used to memorize a plurality of numerical display patterns which correspond with respective speed level ranges of 0–10 km/h, 10–20 km/h, 20–30 km/h, 30–40 km/h, 40–50 km/h, 60–70 km/h, 70–80 km/h, 80–90 km/h, and over 90 km/h. The numerical display pattern for the lowest speed level range is arranged to provide a numerical display of 0–10 km/h in a smallest size, and the numerical display patterns for the other speed level ranges are arranged to provide a numerical display of the vehicle travel speed successively in a larger size in accordance with rise of the speed level. The numerical display pattern for the highest speed level range is arranged to provide a numerical display of the vehicle travel speed over 90 km/h in a largest size. In this embodiment, the largest size of the numerical display is determined to be four times the size of the numerical display for 0–10 km/h. In FIG. 4 there is illustrated an example of the numerical display patterns memorized in ROM. As is understood from the example, each display size of 5 km/h, 60 km/h, 103 km/h is determined on the basis of a numerical display pattern which is selected from the memorized display patterns in accordance with the vehicle speed level.

Hereinafter, the operation of the vehicle speed display device will be described with reference to the flow charts of FIGS. 2 and 3. When connected to an electric power source in the form of a vehicle battery by means of an ignition key switch of the vehicle, the speed display device is conditioned in its operation such that the computer 2 is supplied with the constant voltage from the voltage stabilizer to initiate execution of the predetermined calculation program at a start step 100 in FIG. 2. Subsequently, the computer program proceeds to a set step 101 where the counter, a register, a latch circuit in computer 2 are initialized for the calculation. In such initial operation, the vehicle speed unit, km/h, is displayed on CRT display means 5 in response to an initial display signal from CRT controller 4, and the following calculation will be repeated on the basis of a main routine from a read step 102 to a display step 104 of FIG. 2.

During the above operation, the computer 2 is also under control of a timer to produce an interruption signal therefrom at a time interval, for instance, at each lapse of approximately 0.283 second. During the calculation of the main routine, CPU in computer 2 is responsive to the interruption signal to temporarily halt the calculation of the main routine and starts to execute the following calculation at an interruption step 200 of FIG. 3. When the program proceeds to a read step 201 of FIG. 3, CPU in computer 2 reads the speed data indicative of an instant travel speed of the vehicle from the counter, and subsequently the program proceeds to a renewal step 202 of FIG. 3 where a prior memorized data in RAM is renewed. When the program proceeds to a reset step 203 of FIG. 3, CPU in computer 2 acts to reset the speed data applied from the counter, and subsequently the program returns to the read step 102 of the main routine at a return step 204 of FIG. 3.

At the read step 102 of the main routine, CPU in computer 2 reads the speed data S from RAM, and the program proceeds to a display data step 103 where CPU acts to select a numerical display pattern related to the speed data from the memorized numerical display patterns in ROM and provides a display data under the selected numerical display pattern. At an output step 104 of the main routine, CPU in computer 2 produces an output signal indicative of the display data and applies it to CRT controller 4. Thus, the instant travel speed of the vehicle is numerically displayed on the display means 5 in a size determined by the selected numerical display pattern.

From the above description, it will be understood that during processing of the interruption routine, an instant travel speed of the vehicle is measured by the counter in computer 2 and is temporarily memorized as the speed data in RAM which is renewed at the time interval determined by the interruption signal, and it will be further understood that during processing of the main calculation routine, the level of the instant travel speed is read as the display data to steply enlarge the size of the numerical display in accordance with rise of the speed level and to reduce the size of the numerical display in accordance with fall of the speed level. In the example illustrated in FIG. 4, the numerical display size on display means 5 will enlarge in accordance with increase of the vehicle speed from 5 km/h to 103 km/h, whereas the numerical display size on the display means 5 will reduce in accordance with decrease of the vehicle speed from 103 km/h to 5 km/h.

Although in the above embodiment the CRT display means 5 is adapted to provide the numerical display indicative of the vehicle speed, a liquid crystal display, an electric luminescense or EL display or the like may be adapted to provide the numerical display. It is also noted that the programming for the numerical display control in the form of a software may be replaced with an electronic hard logic circuit.

Figure 5:
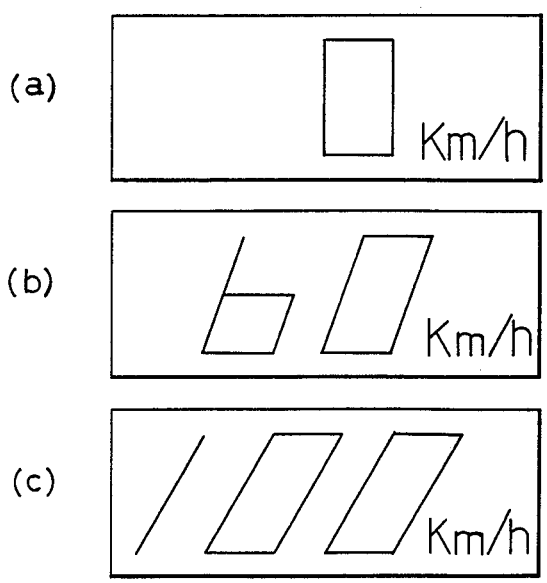
FIG. 5 illustrates numerical display patterns in another embodiment of the present invention.

In FIG. 5 there is illustrated another embodiment for the numerical display control which is arranged to successively incline the shape of the numerical display in accordance with rise of the speed level. In such display control, ROM in computer 2 is arranged to memorize a plurality of numerical display patterns for successively inclining the shape of the numerical display in accordance with rise of the speed level, CPU in computer 2 is responsive to the speed data from RAM to select one of the memorized display patterns in accordance with the level of the speed data and to produce an output signal indicative of a display data under the selected display pattern, and the CRT controller 4 is arranged to adjust the inclination of the numerical display in accordance with the value of the output signal from CPU.

What is claimed is:

1. A speed display device of the numerical display type for automotive vehicles, comprising speed detecting means for producing an electric speed signal indicative of the travel speed of the vehicle, and numberical display means responsive to said speed signal for providing a numerical display indicative of the travel speed of the vehicle, wherein the improvement comprises:
memory means arranged to memorize a plurality of numerical display patterns for enlarging the size of said numerical display in accordance with rise of the speed level;
computer means responsive to said speed signal to select one of said memorized display patterns in accordance with the level of said speed signal and to produce an output signal indicative of a display data under said selected display pattern; and means responsive to said output signal from said computer means for adjusting the size of said numerical display in dependence upon the value of said display data.

2. A speed display device of the numerical display type for automotive vehicles, comprising speed detecting means for producing an electric speed signal indicative of a travel speed of the vehicle, and numerical display means responsive to said speed signal for providing a numerical display indicative of the travel speed of the vehicle, wherein the improvement comprises:

memory means arranged to memorize a plurality of numerical display patterns for inclining the shape of said numerical display in accordance with rise of the speed level;

computer means responsive to said speed signal to select one of said memorized display patterns in accordance with the level of said speed signal and to produce an output signal indicative of a display data under said selected display pattern; and means responsive to said output signal from said computer means for adjusting the inclination of said numerical display in dependence upon the value of said display data.

* * * * *